Nov. 15, 1966 R. L. BARKES 3,286,156

HARMONIC GENERATOR

Filed Dec. 27, 1962 2 Sheets-Sheet 1

INVENTOR.
RALPH L. BARKES

BY
BLAIR & BUCKLES
ATTORNEYS.

INVENTOR.
RALPH L. BARKES
BY
BLAIR & BUCKLES
ATTORNEYS.

United States Patent Office 3,286,156

Patented Nov. 15, 1966

3,286,156
HARMONIC GENERATOR

Ralph L. Barkes, Tampa, Fla., assignor to Trak Microwave Corporation, Tampa, Fla.

Filed Dec. 27, 1962, Ser. No. 247,614
3 Claims. (Cl. 321—69)

This invention relates to a novel high frequency signal source. More particularly, it relates to a radio frequency source in which an oscillator excites a harmonic generator to produce an output signal at a frequency substantially equal to a selected integral multiple of the oscillator signal frequency.

The invention utilizes a single stage harmonic generator constructed in a novel manner to match the impedances of the input signal path and of the output signal path to a variable reactance element that is excited to produce the high frequency output signal. The impedance relationships achieved with this novel construction make possible high efficiency conversion of the lower frequency input signal to the higher frequency output signal. Further features of the invention are the low noise and high frequency stability of the output signal.

The signal sources provided by the invention are advantageously used in high frequency communications equipment, functioning, for example, as local oscillators.

With the use of increasingly higher radio frequencies for communication and for scientific purposes, sources of the high frequency signals are required. Constructing these sources for reliable, stable operation becomes increasingly difficult as the operating frequency is increased. One reason for these problems is that the physical dimensions of the circuit components become commensurate with the short wavelengths of the high frequencies. Similarly, the signal transit time between two points in the source becomes commensurate with the period of the high frequency signals. These relationships between the circuit and the signals being processed therein make the circuit highly susceptible to undesirable oscillations and to unwanted feedback. Further problems are encountered when the source is required to develop a high frequency signal having substantial power.

One solution to these problems is to generate a lower frequency signal and multiply its frequency to achieve the desired higher frequency signal. This can be done with a harmonic generator by applying the signal from an oscillator to a circuit element whose impedance varies non-linearly with the amplitude of the signal applied to it. The element generates a multitude of signals having different frequencies equal to different integral multiples, or harmonics, of the oscillator signal. A selected harmonic can be coupled from the element with a circuit that suppresses all other harmonics to obtain the desired high frequency signal.

Recent work with solid state elements have developed a variable reactance element called a varactor diode, or simply a varactor, that is highly suited for use in high frequency harmonic generators. A varactor may be considered here as a two terminal semiconductor diode utilized not as a rectifying element but rather as a non-linear capacitor. That is, a capacitor whose value varies non-linearly as the voltage across the varactor terminals is varied. Further information regarding varactor harmonic generators may be found in "Single Stage Versus Cascade Harmonic Generator for Local Oscillator" by John Bartnik, published in The Microwave Journal, volume V, No. 9, pp. 204–210 (September 1962), and in the references cited therein.

It is an object of the present invention to provide an improved source of high radio frequency signals. A further object is to provide such a source that produces an output signal of stable frequency and having a low noise level.

It is also an object of the invention to provide a source of high radio frequency signals having considerable power. The signal from such a source can then be utilized directly, without amplification.

A more specific object of the invention is to provide a harmonic generator for use in a source of the above character and that converts a large portion of a lower frequency input signal to an output signal whose frequency is a desired harmonic of the input frequency. The achievement of low conversion loss is complicated by the fact that the variable reactance element should be impedance matched at the lower input signal frequency to the oscillator delivering the input signal and should also be impedance matched at the higher frequency to the output circuit from which the latter signal is coupled.

Hence, a further object of the invention is to provide a varactor harmonic generator in which the varactor impedance is readily matched to the impedance of the input oscillator and to the higher frequency output circuit.

Another object of the invention is to provide a harmonic generator of the above description suitable for use with oscillators of different constructions.

Still another object of the invention is to provide a harmonic generator-type signal source of the above character that has small space and rugged construction.

Other objects of the invention will in part be obvious and and will in part appear hereinafter.

The invention accordingly comprises the features of construction, combination of elements, and arrangement of parts which will be exemplified in the construction hereinafter set forth, and the scope of the invention will be indicated in the claims.

For a fuller understanding of the nature and objects of the invention, reference should be had to the following detailed description taken in connection with the accompanying drawings, in which.

The present source efficiently attains the above objects by applying the signal from an oscillator to a harmonic generator to excite a varactor which generates in the harmonic generator output circuit a desired signal whose frequency is an integral multiple of the frequency of the oscillator signal. In a preferred embodiment of the harmonic generator, the varactor extends across a waveguide with one varactor terminal connected to the waveguide. An aperture is formed in the waveguide opposite this connection and a coaxial transmission line extends from the aperture to the oscillator. One end of the coaxial line inner conductor is connected to the other varactor terminal and the other end is coupled to the oscillator signal.

The coaxial line thus applies the oscillator signal across the varactor, exciting it to generate signals whose frequencies are multiples of the oscillator signal frequency.

Impedance means detailed hereinafter are provided in the coaxial line to minimize the effect of the aperture on the harmonic generator output signal.

The waveguide output circuit is constructed in a novel manner to suppress the unwanted harmonics of the oscillator signal without resorting to resistive, signal dissipating, means. A novel combination of impedance matching techniques are utilized in the waveguide to match its impedance to the varactor impedance at the frequency of the output signal. With this construction, the oscillator signal is converted with minimum conversion loss to provide a substantially noise free and frequency stable output signal.

Figure 1:
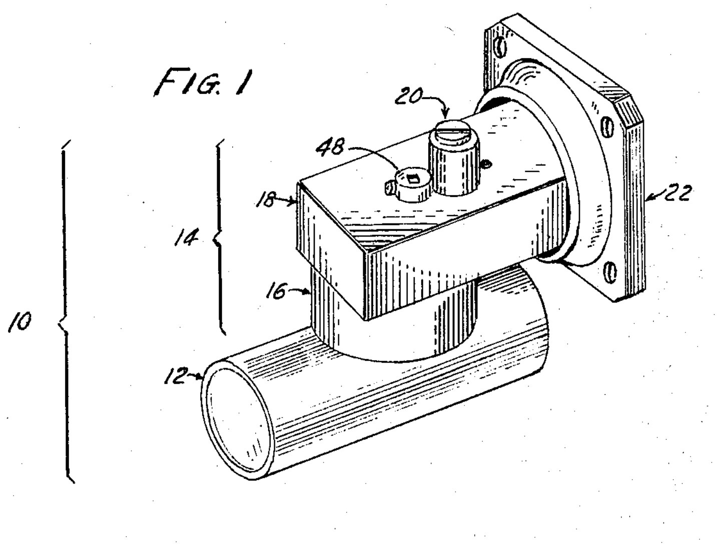
FIGURE 1 is a perspective view of a high frequency signal source embodying the invention.

Turning now to FIGURE 1, a source indicated generally at 10 embodying the invention is constructed with an oscillator indicated generally at 12, generating a signal of frequency *f1*, which drives a harmonic generator indicated generally at 14. The harmonic generator 14 has coaxial transmission line section indicated generally at 16 coupling the signal from the oscillator 12 to a waveguide indicated generally at 18. A tuning control indicated generally at 20 allows the frequency *f2* of the harmonic generator output signal, delivered to the waveguide flanged end 22, to be readily varied over a substantial range.

Figure 2:
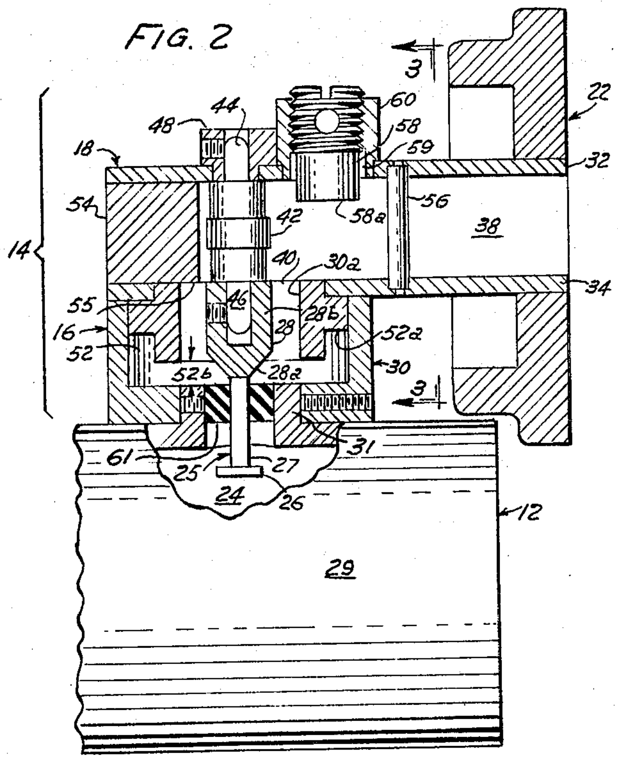
FIGURE 2 is a fragmentary side elevational view of the signal source of FIGURE 1 with the harmonic generator thereof in section.
Figure 3:
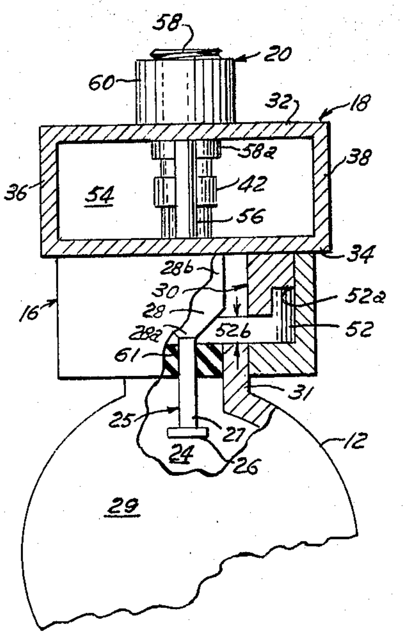
FIGURE 3 is an end elevation view of the source of FIGURE 1, partly in section along line 3—3 of FIGURE 2 and partly broken away.

The oscillator 12 is suitably a high frequency triode oscillator having two resonant circuits, generally constructed as cavities such as the cavity 24 indicated in FIGURES 2 and 3. The resonant circuits are coupled together through a triode (not shown), as is well known in the art. Oscillators of this type are described in "The Principles of Radar" by Reintjes and Coate, Chapter 10, 3rd edition, McGraw-Hill Book Company, Inc., 1952. However, it should be noted that the principles of the present invention are not limited to a particular oscillator construction.

As shown in FIGURES 2 and 3, the oscillator signal is capacitively coupled from the oscillator cavity 24 to the harmonic generator 14 by a probe 25 having an annular disc 26 conected to the bottom of a cylindrical rod 27. The probe rod 27 is connected to a frustro conical portion **28*a* of a conductor 28 forming the inner conductor of the coaxial line section 16, which has an outer conductor indicated generally at 30**.

In the illustrated embodiment of the source 10, the oscillator 12, having a cylindrical housing 29, has a collar 31 that interfits in the lower portion of the outer conductor 30. The tapered portion **28*a* of conductor 28 provides a gradual transition, to reduce impedance dicontinuities, between the coaxial transmission line formed by collar 31 and probe rod 27 and the coaxial transmission line formed by the outer conductor 30 and the conductor cylindrical portion 28*b***.

The waveguide 18 is preferably rectangular, having a pair of horizontal wide walls 32 and 34 spaced apart by a pair of vertically-disposed narrow walls 36 and 38. An aperture 40 is formed through the wall 34, as shown in FIGURE 2, to connect with the coaxial line outer conductor 30. A varactor diode 42, hereafter referred to as a varactor, has a terminal 46 connected to the upper end of the inner conductor 28 and extends from the aperture 40 within the waveguide 18 between its wide walls 32 and 34. A clamp 48, mounted in the waveguide wall 32, connects the other varactor terminal 44 to the waveguide wall 32. Thus the varactor 42 extends across the waveguide parallel to the electric field of the dominant, $TE_{10}$, mode of signals propagating in the waveguide. Similarly, the electric field developed in the varactor's capacitance is parallel to the electric field of the waveguide signals.

With this construction, the oscillator signal, coupled from the oscillator 12 by the probe 25, is applied by the inner conductor 28 and the outer conductor 30 between the varactor terminals 44 and 46.

Continuing with reference to FIGURES 2 and 3, the coaxial line section 16 has a choke formed in the outer conductor 30 to minimize the effect of the aperture 40 on the output signal from the harmonic generator 14. To this end, an annular slot 52 is formed in the outer conductor 30. In the present embodiment, the slot 52 extends radially for a short distance and then extends axially to the end **52*a***; this configuration enhances the small size of the harmonic generator.

The electrical length of the slot, from the gap **52*b* it forms in the outer conductor 30 to its end 52*a***, is approximately a quarter wavelength at the central frequency *f2* of the frequency range of the harmonic generator output signal. Similarly, the electrical distance along the coaxial line section 16 from the aperture 40 to the gap **52*b*** is approximately a quarter wavelength at the same frequency *f2* so that the overall electrical path length from the aperture 40 to the slot's remote end **52*a*** is substantially a half wavelength.

With this construction, at the frequency *f2*, the slot 52 operates as a quarter wavelength transmisison line having a short circuit at the slot end **52*a*. This short circuit appears as a high impedance across the gap 52*b*, and is in series with the impedance between the inner conductor 28 and the outer conductor 30. The series combination of these two impedances appears at the aperture 40, which is a quarter wavelength away, as a low impedance between the inner conductor 28 and the outer conductor rim 30*a* that forms the aperture 40. As a result, the aperture 40** has little or no effect on signals at the frequency *f2*, since it appears as a low impedance similar to the continuous waveguide walls. Although described for operation at the central frequency *f2*, it has been found that this same operation is achieved over a relatively wide range of frequencies centered about the frequency *f2*.

A conductive block 54, shown in FIGURES 2 and 3, is connected as by silver soldering into the waveguide 18 spaced from the center of the varactor 42 less than a quarter wavelength, and generally substantially at an eighth wavelength, at the output signal frequency *f2*. Thus the block 54 forms a short circuit in the waveguide 18 that appears to the varactor 42, at the frequency *f2*, as a large inductive reactance. As seen in FIGURE 2, with this positioning of the block 54, it protrudes at 55 across a portion of the aperture 40.

A conductive post 56, preferably formed as a cylindrical rod, is connected between the wide waveguide walls 32 and 34 spaced on the other side of the varactor from the shorting block 54. As is well known, such a post produces an inductive reactance shunting the waveguide at its central operating frequency *f2*.

As also seen in FIGURES 2 and 3 the tuning control 20 is constructed with a plug 58 of conductive material threadably retained by a collar 60 connected to the waveguide wide wall 32. A smooth plane end **58*a* of the plug protrudes into the waveguide through an aperture 59 in the wall 32. The length of the plug in the waveguide can readily be adjusted by screwing the plug in or out of the collar 60. Generally, the plug is adjusted to protrude in the waveguide 18 for a distance less than half the spacing between the waveguide walls 32 and 34** to present a capacitive reactance.

Further features of the novel construction of the present source are that the conductor 28 and the probe 25 preferably are supported coaxially within their respective outer conductors, the conductor 30 and the collar 31. In the illustrated embodiment, this is achieved with a dielectric disc 61 (FIGURES 2 and 3) fitted around the probe rod 27 and clamped in the oscillator collar 31. It will also be noted that the length of the probe 25 extending into the oscillator cavity 24 can readily be adjusted by changing the penetration of the varactor terminals 44 and 46 in the clamp 48 and in the conductor 28, respectively.

As seen in FIGURE 3, varactor 42, the post 56 and the plug 58 are disposed in the waveguide midway between the narrow walls 36 and 38 to affect the fields in the waveguide symmetrically.

Turning to the operation of the signal source described herein, I have found that minimum conversion loss is achieved by operating the varactor 42 of FIGURE 2 with no external bias voltage. This operation provides a further advantage, in that no conductors of D.C. bias voltage are required between the varactor and a D.C. supply. In harmonic generators requiring such conductors, substantial energy leaks from the source on the bias conductors. The filters added to impede this leakage then add further complexity, weight, size and cost to the source. The operation of the varactor under this condition of no external bias will now be explained with reference to FIGURE 5.

Figure 5:
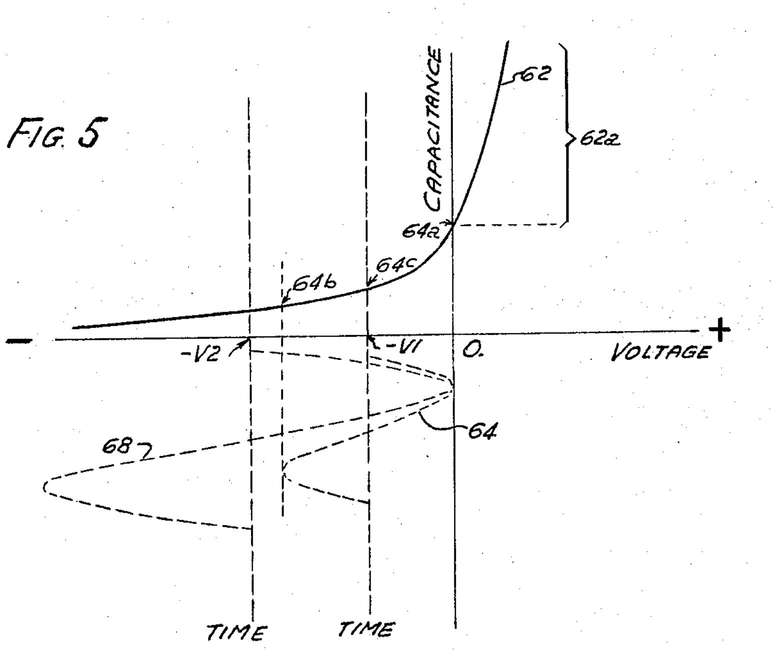
FIGURE 5 is a simplified graph illustrating the operation of the varactor in the signal source of FIGURE 1.

The variable capacitance characteristic of the varactor 42 is illustrated by the curve 62 shown in the graph of FIGURE 5, where the varactor capacitance is plotted along the ordinate as a function of voltage across the varactor terminals, which is plotted on the abscissa. The non-linearity of the varactor capacitance, responsible for generating harmonics of the oscillator signal, as the voltage across the varactor varies, is indicated by the departure of the curve 62 from a straight line.

With the above-described construction for the source 10, there is no D.C. conductive path from the waveguide wall 32 (FIGURE 2) through the varactor 42 and back to the structure of the source. Hence, no direct current can exist in the varactor. This limitation requires that no positive voltage be developed across the varactor. Otherwise, it would conduct current as a conventional diode. In terms of the FIGURE 5 graph, this means the varactor cannot operate along the portion **62*a* of the curve 62 that lies to the right of the ordinate, or vertical axis, and corresponds to positive voltage. It should be noted that since the varactor does not function as a rectifier, it can be inserted in the waveguide with its cathode terminal connected to either wall 32 or 34**.

The operation of the varactor under these conditions can readily be understood by assuming that a small amplitude sinusoidal signal is applied across the varactor terminals 44 and 46 (FIGURE 2). This small amplitude signal is indicated in FIGURE 5 by the dashed voltage waveform 64 plotted as a function of time. In response to this signal, the capacitance of the varactor will vary on the curve 62 between the limits **64*a* and 64*b*. The limit 64*a* coincides substantially with the capacitance at zero voltage, since the varactor is precluded from operating with a positive voltage. The lower capacitance limit 64*b* is then determined by the amplitude of the voltage waveform 64. Thus, when driven by the voltage waveform 64, the capacitance of the varactor varies symmetrically on the curve 62 about the central capacitance value 64*c*. This capacitance value 64*c* coincides with an average varactor voltage having a negative value of V1, as shown on the graph. Accordingly, the varactor is said to be self-biased at the negative voltage V1**.

When a signal of larger amplitude, such as that indicated by the voltage waveform 68, is applied across the varactor terminals, the varactor becomes self-biased at the negative voltage V2, shown in FIGURE 5.

Figure 4:
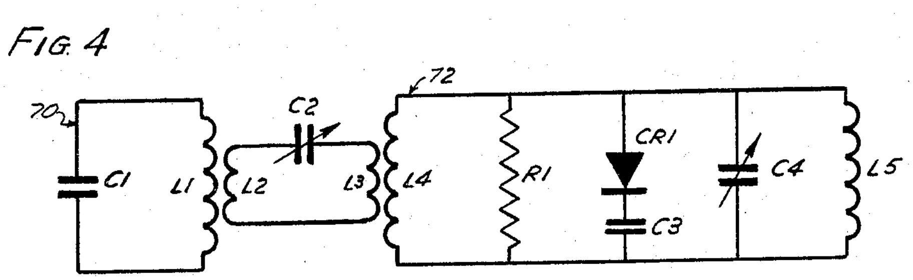
FIGURE 4 is a simplified schematic representation of the signal source of FIGURE 1.

FIGURE 4 is a simplified schematic representation of the signal source described hereinabove. The parallel L1–C1 circuit 70 represents the oscillator's output resonant circuit, indicated in FIGURES 2 and 3 as the cavity 24. The probe 25 and the coaxial line section 16 of FIGURES 2 and 3 function electrically as an inductor L2 coupled with the inductor L1 and in series with a variable capacitor C2 and an inductor L3 coupled with the waveguide equivalent circuit 72. The capacitor C2 is varied by varying the depth of the probe 25 in the cavity 24.

The impedances inserted in the waveguide 18 by the shorting block 54, the varactor 42, the plug 58 and the post 56, can be represented respectively, by an inductor L4; the series combination of a diode CR1 and a capacitor C3; a variable capacitor C4; and an inductor L5, each connected in parallel in the waveguide circuit 72. The value of the capacitor C4 is changed by changing the length of the plug 58 in the waveguide.

As also shown in FIGURE 4, the resistive losses in the harmonic generator, including losses in the varactor 42 (FIGURES 2 and 3), are represented as a resistor R1 shunting the waveguide circuit 72.

During the operation of the source constructed in the manner described above, the oscillator 12 signal, at a frequency *f*1, is coupled from the cavity 24 by the probe 25. The coaxial line section 16, FIGURES 1, 2 and 3, guides the signal to the waveguide 18, applying it between the wide waveguide walls 32 and 34 and across the varactor 42.

The slot 52, described above as electrically a quarter wavelength long between its end **52*a* and the gap 52*b*** at the higher frequency *f*2 of the output signal, presents an inductive reactance to the coaxial section at the oscillator frequency *f*1. This inductive reactance serves to compensate the capacitive reactances in the coaxial section to impedance match the section to the varactor at the oscillator signal frequency *f*1. This frequency matching enhances the coupling of the oscillator signal to the varactor; important in maximizing the conversion efficiency with which the oscillator signal is converted to the higher frequency harmonic generator output signal at the frequency *f*2.

The oscillator signal drives the varactor along its non-linear capacitance characteristic in the manner described above with reference to FIGURE 5. The non-linear changes in varacator capacitance tend to generate in the waveguide 18 a multiplicity of signals having different frequencies equal to different integral multiples, or harmonics, of the oscillator signal frequency *f*1.

The impedances in the waveguide 18 suppress all the signals generated by the varactor except the desired signal of frequency *f*2 to which the waveguide is tuned. More specifically, the phase and the amplitude of the reactances presented to the varactor by the shorting block 54, the inductive post 56 and the capacitive plug 58 are such that the signals generated by the varactor at frequencies other than the frequency *f*2 in effect do not propagate in the waveguide 18. Accordingly, little energy from the oscillator signal is expended in the varactor to generate the unwanted signals.

At the frequency *f*2, however, the waveguide presents a matched impedance to the varactor 42. As a result, the varactor delivers substantial energy to the waveguide at the frequency *f*2. This desired signal propagates substantially unattenuated in the waveguide to its flanged end 22, seen in FIGURES 1 and 2.

I have found that the spacing of the shorting block 54 from the varactor 42, FIGURE 2, is fairly sensitive in seeking to maximize the conversion efficiency, i.e., in seeking to maximize the amplitude of the desired output signal at the frequency *f*2 with a constant amplitude signal from the oscillator. Since the radio frequency characteristics of different varactors, even of the same type designation, differ substantially, the exact spacing for optimum operation generally varies for each varactor. However, a spacing of approximately an eighth wavelength at the output frequency *f*2 consistently provides satisfactory operation.

The amplitude of the output signal is further enhanced when the inductive post is spaced from the varactor 42 toward the flanged end 22 of the waveguide, and the capacitive plug 58 is disposed intermediate the post and the varactor.

As noted above, two adjustments are provided for matching a particular varactor to the source 10 of FIGURE 1. Thus, in addition to adjusting the length of the probe 25 that extends into the oscillator cavity 24, FIGURE 2, the plug 58 can be threaded further in or out of the waveguide 18 to maximize the output signal power at the desired output frequency.

In an embodiment of the invention for generating continuous wave energy at X-band frequencies, that is from 8,400 to 12,000 megacycles, an oscillator 12, FIGURE 1, is used that operates at S-band frequencies, between 2,600 and 3,950 megacycles. In this instrument, the harmonic generator operates as a frequency tripler, delivering the third harmonic of the oscillator signal to the flanged end 22 of the waveguide 18.

Specifically, one source operating at these frequencies generates an output signal ranging in frequency, about the center frequency $f2$, between 8,300 and 8,500 megacycles. With an input power from oscillator 12 of only 50 milliwatts, the source output signal power level exceeds 4 milliwatts. For a single frequency, the source can be readily tuned to provide output power in excess of 15 milliwatts. For this operation, the spacing between the shorting block 54, FIGURES 2 and 3, and the center of the varactor is 0.125 inch. One suitable varactor for this operation, manufactured by Microwave Associates, Inc., of Burlington, Massachusetts, is identified as type MA4344A. This example of the present invention is presented only by way of example; the principles of the invention are not so limited.

An oscillator 12 (FIGURE 1) operating at C-band frequencies, 3,950 to 5,850 megacycles, can also be used to produce an X-band output signal from the source 10. In this instance, the harmonic generator 14 constructed as described above operates as a doubler, delivering the second harmonic of the oscillator signal to the flanged end 22 of the waveguide 18.

The source construction described herein maintains the frequency of the output signal substantially constant as the ambient temperature of the source varies. Specifically, in the X-band sources discussed above, when the temperature ranges between 0° C. and 100° C., the output frequency variation is less than 3.0 megacycles.

For operating the present source 10, FIGURE 1, with different oscillators and with different varactors, the construction of the probe 25 shown in FIGURES 2 and 3 can be modified to attain the desired impedance matching in the input circuit of the source, i.e., between the oscillator 12, the coaxial transmission line section 16 and the waveguide structure that couples the oscillator signal to the varactor 42. I have found it particularly desirable to increase the capacitive reactance of the probe to achieve optimum conversion efficiency.

In summary, described above is a high frequency signal source utilizing a novel single stage harmonic generator. The source is constructed in a novel manner to achieve efficient frequency conversion and generates an output signal whose frequency is stable over a wide range of operating temperatures. Moreover, noise or unwanted signals are maintained at a negligible level in the source output.

It will thus be seen that the objects set forth above, among those made apparent from the preceding description, are efficiently attained and, since certain changes may be made in the above construction without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention which, as a matter of language, might be said to fall therebetween.

Having described the invention, what is claimed as new and secured by Letters Patent is:

1. In a harmonic generator for operation with an oscillator energizing an output cavity with a signal of a first frequency, the combination comprising (A) a coupling probe arranged to protrude into said cavity, (1) a cylindrical disc connected on the end of said probe that fits within said cavity for increasing the capacitive reactance with which said probe is coupled to said cavity, (B) a coaxial transmission line having an inner conductor concentrically disposed within an outer conductor, (1) said inner conductor being coupled with the end of said probe remote from said cavity, and (2) said outer conductor being coupled with said cavity, (a) so that said oscillator signal is coupled from said cavity to said coaxial transmission line, (C) a rectangular waveguide (1) means forming an aperture through a first wall of said waveguide, (2) said coaxial transmission line communicating with said waveguide at said aperture with said outer conductor connected to said first waveguide wall, (D) a varactor diode connected between said inner conductor and a second wall of said waveguide opposite said first wall, (1) said probe and said coaxial transmission line matching the impedance of said varactor at said first frequency to the impedance of said oscillator cavity, (2) said coaxial transmission line applying said oscillator signal between said first and second walls of said waveguide and across said varactor to excite said varactor, (3) said varactor being self-biased by said oscillator signal at a negative bias voltage and generating an output signal at a second frequency as a harmonic of said oscillator signal, (E) a conductive shorting block connected in said waveguide closely spaced from said varactor to present a large inductive reactance to said varactor at said second frequency of said output signal, (F) an inductive post connected between said first and second waveguide walls spaced from said varactor on the opposite side thereof from said shorting block, (G) a capacitive plug threadably mounted in said second waveguide wall and adjustably protruding into said waveguide, (1) said plug being disposed intermediate said varactor and said inductive post, (2) said shorting block, said inductive post, and said capacitive plug tuning said waveguide to propagate said output signal with negligible loss and to suppress signals at frequencies other than said second frequency.

2. The source defined in claim 1 in which (A) said coaxial transmission line is constructed with a series choke and presents a low impedance, at said second frequency, across said aperture between said outer conductor and said inner conductor, (1) so that said aperture has substantially negligible effect on said output signal, (B) said inner conductor of said coaxial transmission line has a tapered section of frusto-conical shape.

3. In a harmonic generator for producing a high frequency signal, the combination comprising (A) a waveguide having a longitudinal axis, (B) a conductive wall connected across said waveguide at a first location on said axis and forming a low impedance shunting said waveguide, (C) a varactor diode disposed within said waveguide and extending vertically between opposed surfaces thereof with a first terminal electrically connected to said waveguide, (1) said diode being spaced along said axis from said conductive wall by a distance less than a quarter wavelength at the frequency of said signal, (D) transmission line means connected with said waveguide and a second terminal of said diode for applying radio frequency energy across said diode, (E) a conductive post extending vertically between and electrically connected to opposed surfaces of said waveguide, (1) said post intersecting said axis at a point located beyond said diode from said wall, (2) said post presenting to said waveguide an inductive shunt impedance at the frequency of said signal, (F) a conductive plug electrically connected to said waveguide at a location intermediate said diode and said post, and adjustably protruding vertically into said waveguide between said opposed surfaces for a distance less than one half the spacing therebetween, (1) said plug presenting to said waveguide a capacitive shunt impedance at the frequency of said signal, (2) said wall, said post, and said plug operating to impedance-match said waveguide to said diode and to suppress undesired signal frequencies.

References Cited by the Examiner

UNITED STATES PATENTS

| | | | |
|---|---|---|---|
| 2,408,420 | 10/1946 | Ginzton | 321—60 |
| 2,460,109 | 1/1949 | Southworth | 332—52 |
| 2,813,973 | 11/1957 | McCoy et al. | 325—445 |
| 3,076,132 | 1/1963 | Kleinman et al. | 321—69 |
| 3,085,205 | 4/1963 | Sante | 331—76 |
| 3,060,365 | 10/1963 | Crandell | 331—76 |
| 3,223,918 | 12/1965 | Ludwig et al. | 321—69 |
| 3,239,744 | 3/1966 | Ludwig et al. | 321—69 |

JOHN F. COUCH, *Primary Examiner.*

JOHN KOMINSKI, *Examiner.*

G. GOLDBERG, *Assistant Examiner.*